(12) United States Patent
Boettcher et al.

(10) Patent No.: US 6,188,124 B1
(45) Date of Patent: Feb. 13, 2001

(54) SEMICONDUCTOR ARRANGEMENT PREVENTING DAMAGE DURING CONTACT PROCESSING

(75) Inventors: Gregory S. Boettcher; Robert P. Katz, both of Hopewell Junction; Ashwani K. Malhotra, Newburgh; James Wood, Beacon, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/354,374

(22) Filed: Jul. 14, 1999

(51) Int. Cl.[7] .................................................. H01L 23/544
(52) U.S. Cl. ............................................ 257/620; 257/797
(58) Field of Search ............................ 257/620, 797; 438/462, 465; 430/5, 322, 327

(56) References Cited

U.S. PATENT DOCUMENTS

| | | |
|---|---|---|
| 3,951,701 | 4/1976 | Csillag . |
| 4,194,233 | 3/1980 | Jones et al. . |
| 5,430,325 * | 7/1995 | Sawada et al. ..................... 257/618 |
| 5,763,936 * | 6/1998 | Yamaha et al. ..................... 257/644 |
| 6,066,883 * | 5/2000 | Hosier et al. ..................... 257/452 |

OTHER PUBLICATIONS

Sorab K. Ghandhi, VLSI Fabrication Principles Silicon and Gallium Arsenide, Second Edition, pp. 674–675 (1994).
Stanley Wolf, Richard N. Tauber, Silicon Processing for the VLSI Era, vol. 1, pp. 430–432.

* cited by examiner

Primary Examiner—Sara Crane
(74) Attorney, Agent, or Firm—Ratner & Prestia; Ira D. Blecker, Esq.

(57) ABSTRACT

A semiconductor arrangement having a first active region and a dummy region on a surface of a substrate. The first active region and the dummy region are spaced from one another without any contact, and the dummy region is closer to an edge of the surface of the substrate in comparison to the first active region. Formed on the dummy region, first active region, and a portion of the substrate surface is a dielectric layer. The surface of the dielectric layer has an inactive portion and an active portion. A mask is disposed on the dielectric layer such that the mask contacts the inactive portion and does not contact the active portion.

20 Claims, 4 Drawing Sheets

SEMICONDUCTOR ARRANGEMENT PREVENTING DAMAGE DURING CONTACT PROCESSING

TECHNICAL FIELD

The present invention relates generally to a semiconductor arrangement and, more specifically, to a semiconductor arrangement that limits damage caused by mask contact processing of the semiconductor arrangement.

BACKGROUND OF THE INVENTION

Masks are conventionally used to form desired films, layers, structures, and the like during the processing of a semiconductor arrangement. As illustrated in FIG. 1, a conventional two-level semiconductor arrangement 1 includes a semiconductor substrate 10. A first active region 18, a dielectric layer 20, and a second active region 28 are disposed on or over semiconductor substrate 10. In forming the second active region 28, a mask 30, as illustrated in FIG. 2, is applied to the dielectric layer 20. Application of mask 30 on dielectric layer 20 occurs at the highest point 21 of the surface of the dielectric layer 20 underlying mask 30.

Physical contact between mask 30 and the dielectric layer 20 at the highest point 21 risks damage to the dielectric layer 20, such as by scratching the dielectric layer 20. Damage to the dielectric layer 20 has not been a problem for conventional semiconductor arrangements, such as that illustrated in FIG. 1, because mask 30 contacts the dielectric layer 20 at an inactive surface portion 23 of the dielectric layer 20, which is an area that will be free of active semiconductor circuitry. The second active region 28 will ultimately reside on an active portion 24 of the dielectric layer 20, which is not contacted by the mask 30. Damage to the inactive surface portion 23 of the dielectric layer 20 can be removed without great difficulty by subsequent processing, such as by dicing. Alternatively, in some semiconductor arrangements, damage to the inactive surface portion 23 of the dielectric layer 20 can be ignored without affecting performance.

Recently, the increased demand for larger active portions 24 has led to the positioning of active regions closer to the edge of the semiconductor arrangement. This configuration more fully utilizes the substrate real estate. Such an arrangement is illustrated in FIG. 3: the second active region 28 is closer to the edge 25 of the dielectric layer 20 in the semiconductor arrangement of FIG. 3 than it is in the semiconductor arrangement of FIG. 1.

In forming second active region 28, mask 30 is again applied to the semiconductor arrangement 1, as illustrated in FIG. 4. The mask 30 causes damage to the active portion 24 of the dielectric layer 20, however, where the second active region 28 will ultimately reside. Unfortunately, this damage cannot be ignored because it affects formation of the second active region 28, thereby affecting performance of the semiconductor chip. Although further processing can repair defects of the damaged second active region 28, such repair processing incurs additional time and expense and is therefore undesirable.

The deficiencies of the processing of conventional semiconductor arrangements show that a need exists for a new semiconductor arrangement which limits damage caused by physical contact between a mask and a portion of the dielectric layer that will ultimately comprise a second active region.

SUMMARY OF THE INVENTION

To overcome the shortcomings of conventional semiconductor arrangements, a new semiconductor arrangement and process of fabrication are provided. An object of the present invention is to provide a semiconductor arrangement that reduces physical contact between a mask and active portions of the dielectric layer. A related object is to reduce damage to the active portions otherwise caused by physical contact of the mask during processing of the semiconductor arrangement.

To achieve these and other objects, and in view of its purposes, the present invention provides a semiconductor arrangement and process of fabrication. The semiconductor arrangement of the present invention comprises a substrate having disposed on a top surface a first active region and a dummy region. The first active region. Formed on the top surface of the substrate, over the dummy region and the first active region, is a dielectric layer. The surface of the dielectric layer has an inactive portion and an active portion. A mask is applied to the dielectric layer such that the mask contacts the inactive portion and does not contact the active portion.

The present invention also provides a process of fabricating a semiconductor arrangement. First, a first active region and a dummy region are formed on a top surface of a substrate. The first active region and dummy region are formed such that the first active region and the dummy region are spaced from one another without any contact, and the dummy region is closer to an edge of the surface of the substrate in comparison to the first active region. Next, a dielectric layer is formed on the first active region, the dummy region, and a portion of the surface of the substrate which is not covered by the first active region and the dummy region. The dielectric layer has a surface having an inactive portion and an active portion. Next, a mask is applied to the dielectric layer such that the mask contacts the inactive portion and does not contact the active portion.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DESCRIPTION OF THE INVENTION

The present invention will next be illustrated with reference to the figures in which similar numbers indicate the same elements in all figures. Such figures are intended to be illustrative, rather than limiting, and are included to facilitate the explanation of the apparatus of the present invention.

Figure 1:
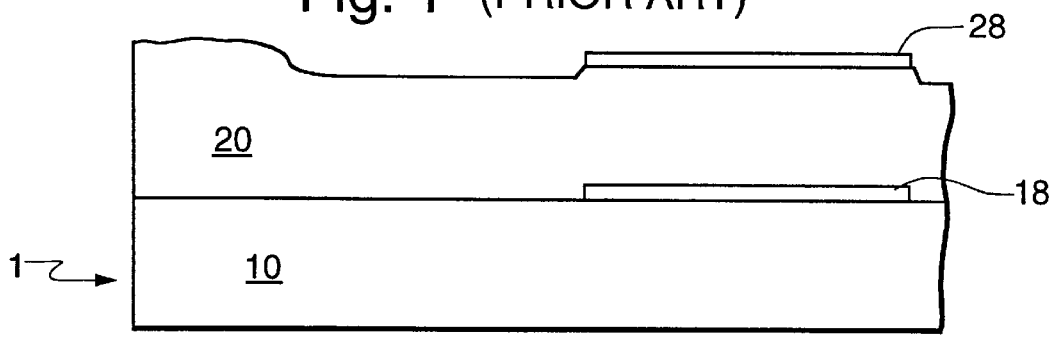
FIG. 1 shows in schematic representation a conventional two-level semiconductor arrangement.
Figure 2:
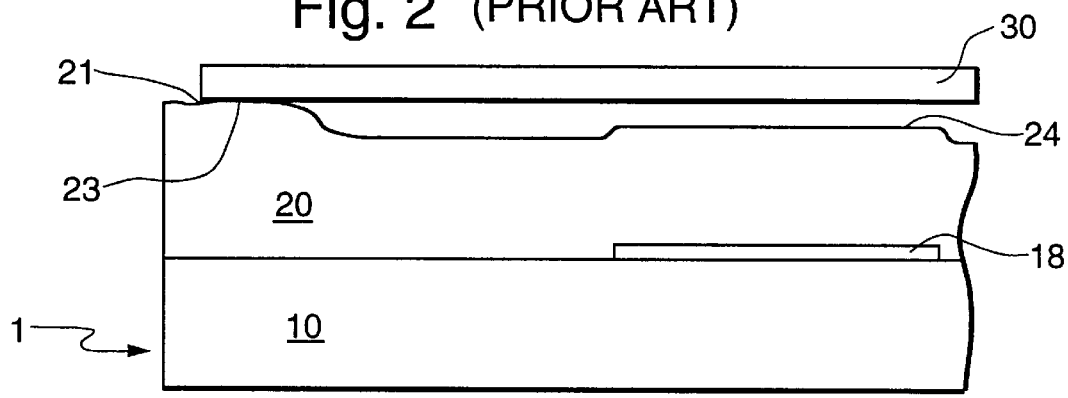
FIG. 2 shows in schematic representation a conventional semiconductor arrangement having a mask applied on the semiconductor arrangement.
Figure 3:
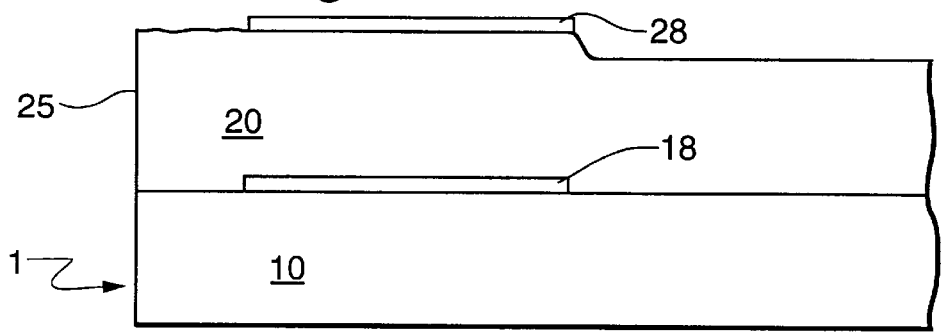
FIG. 3 shows in schematic representation another conventional two-level semiconductor arrangement.
Figure 4:
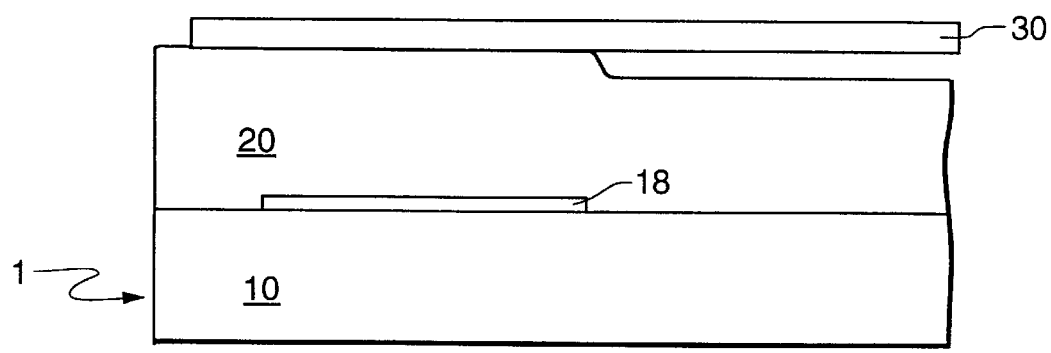
FIG. 4 shows in schematic representation another conventional semiconductor arrangement having a mask applied on the semiconductor arrangement.
Figure 5:
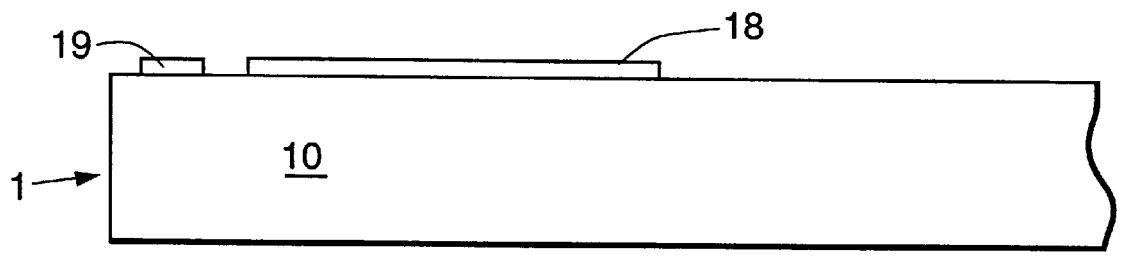
FIG. 5 shows in schematic representation a substrate having a first active region and a dummy region formed on the substrate in accordance with the present invention.

The process of the invention begins by forming a first active region 18 and a dummy region 19 on a substrate 10. FIG. 5 illustrates the resulting structure of semiconductor arrangement 1. Substrate 10 is composed of those materials conventionally used as semiconductor substrates, such as silicon or ceramic.

First active region 18 is formed on the substrate 10 using techniques that are well known and that are not critical to the invention. These techniques include, for example, selective deposition of a material using photolithography or selective evaporation of a material through a mask. The first active region 18 can be any of those materials conventionally used, and is typically a metal such as copper, aluminum, tungsten, chromium, a combination of these metals, and the like.

Dummy region 19 is formed on the substrate 10 using techniques typically used for the selective formation of a layer on a substrate, such as selective deposition of a material using photolithography or selective evaporation of a material through a mask. The dummy region can be a metal, such as copper, aluminum, tungsten, chromium, a combination of these metals, and the like. The dummy region 19 can also be a dielectric material. Preferably, the dummy region 19 is formed using the same processing scheme as that used to form the first active region 18 in order to reduce the number of processing steps.

Figure 6:
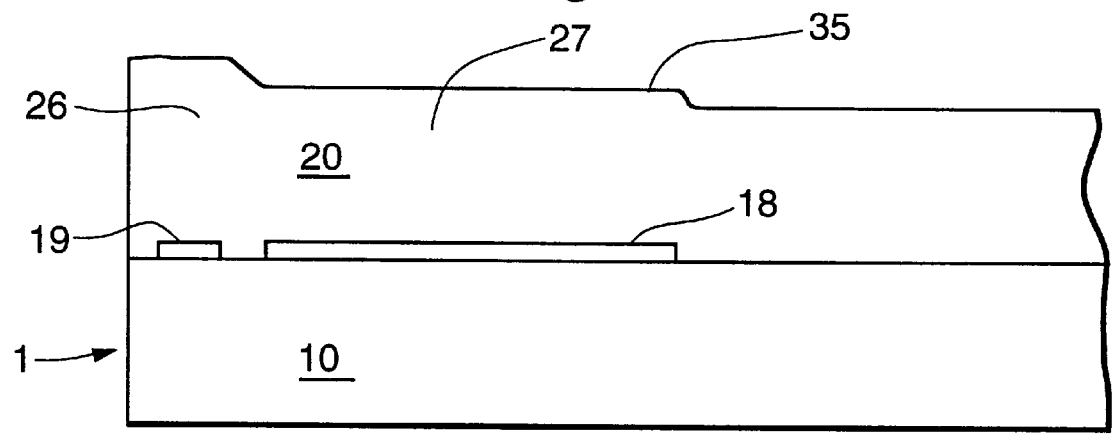
FIG. 6 shows in schematic representation the substrate of FIG. 5 further having a dielectric layer formed on the substrate.

Following formation of the dummy region 19 and first active region 18, the next step in the process of the present invention is the formation of a dielectric layer 20. The resulting structure is illustrated in FIG. 6. As shown in this figure, the dielectric layer 20 has the characteristic that it conforms to the shape of the underlying surfaces of the substrate 10, first active region 18, and dummy region 19. Thus, the top surface 35 of the dielectric layer 20 is non-planar due to the non-planar shape of the underlying surface, which consists of the substrate 10, first active region 18, and dummy region 19. This non-planarity is a characteristic of dielectric layers conventionally used, such as silicon oxides, silicon nitrides, polyimides, and combinations of these materials.

The dielectric layer 20 illustrated in FIG. 6 has been formed by a spin-apply process. As illustrated in this figure, the height of an edge portion 26 of the dielectric layer 20 is greater (i.e., the dielectric layer 20 is thicker) than that of the center portion 27 of the dielectric layer 20. This height variation is a result of the spin-apply process, a technique conventionally used in forming a dielectric layer. This height variation is referred to as an "edge effect" and is described, for example, by S. Wolf and R. Tauber on pages 430–32 of their book titled, "Silicon Processing for the VLSI Era," Volume 1—Process Technology (1986). Preferably, dielectric layer 20 is formed by a spin-apply process. The edge effect is also exhibited by the extrusion process and meniscus coating process, which can also be used in forming the dielect layer of the present invention.

Figure 7:
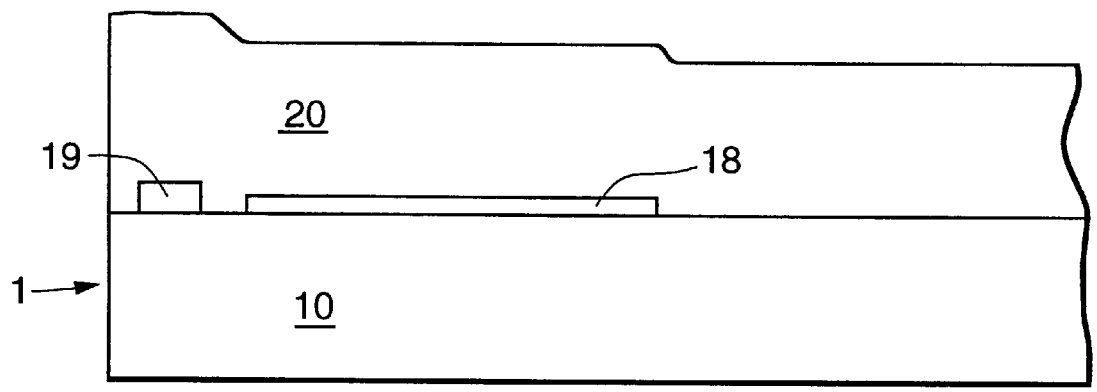
FIG. 7 shows in schematic representation a substrate having a first active region, a dummy region, and a dielectric layer formed on the substrate.

In accordance with the present invention, dielectric layer 20 can also be formed by chemical vapor deposition (CVD). When forming the dielectric layer 20 by chemical vapor deposition, the edge portion 26 and center portion 27 of the dielectric layer 20 do not typically exhibit the "edge effect" as described above with reference to FIG. 6. As a result, the dummy region 19, as illustrated in FIG. 7, is formed such that it has a greater height than the first active region 18. It has been discovered that introducing a dummy region 19 having a height greater than that of the first active region 18 results in a dielectric layer 20 having an edge portion 26 of a greater height than that of the center portion 27. The process step of forming a dummy region 19 having a greater height than that of the first active region 18 can also be used when the dielectric layer 20 is spin-on applied or formed by the extrusion process or meniscus coating process.

Figure 8:
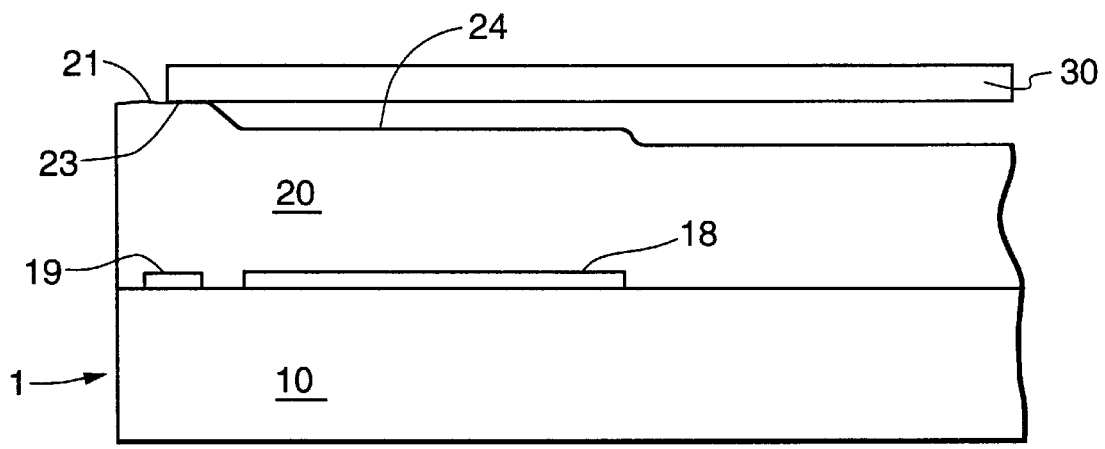
FIG. 8 shows in schematic representation the substrate of FIG. 6 further having a mask formed on the dielectric layer.
Figure 9:
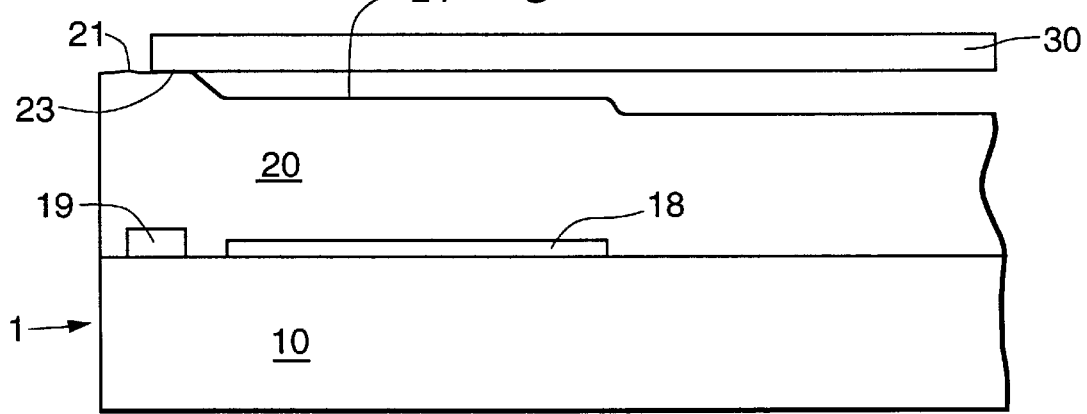
FIG. 9 shows in schematic representation the substrate of FIG. 7 further having a mask formed on the dielectric layer.

In the next step of the process of the present invention, a mask 30 is applied to the dielectric layer 20 in order to form a second active region 28 on the dielectric layer 20. The resulting structures are illustrated in FIGS. 8 and 9. In FIG. 8, a mask 30 has been applied to the structure of FIG. 6, in which the dummy region 19 has substantially the same height as the first active region 18. In FIG. 9, a mask 30 has been applied to the structure of FIG. 7, in which the dummy region 19 has a height greater than the height of the first active region 18.

Mask 30 can be any of those masks conventionally used. The mask composition is not critical to the present invention. Examples of suitable masks used to further process the semiconductor arrangement 1 of the present invention include masks used in the evaporation of glasses or metals.

As illustrated in FIGS. 8 and 9, mask 30 rests on the highest point 21 of the dielectric layer 20, which has been elevated by the underlying dummy region 19. As a result, the mask 30 contacts the dielectric layer 20 at an inactive surface portion 23 rather than at an active portion 24. By constructing the semiconductor arrangement 1 as described above, a second active region 28 can be formed on a portion of the dielectric layer 20 that has not been physically contacted by the mask 30.

Figure 10:
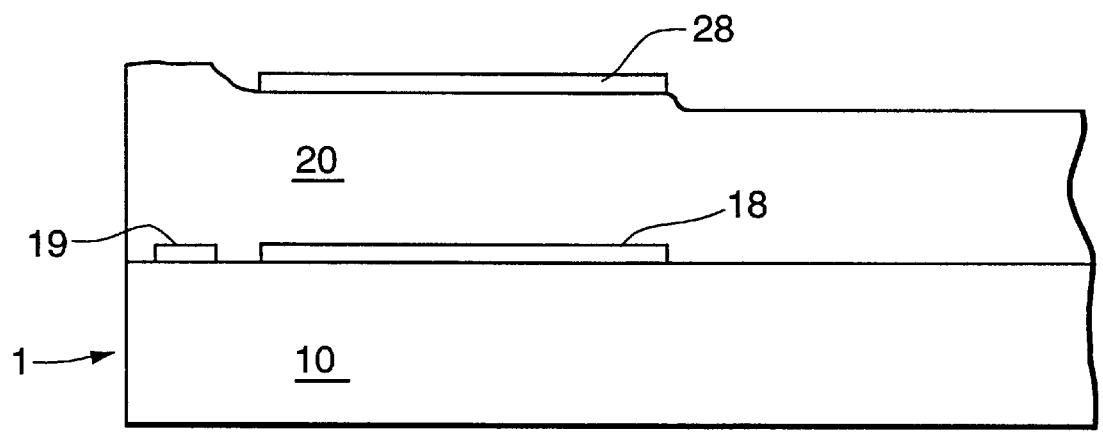
FIG. 10 shows in schematic representation the substrate of FIG. 6 further having a second active region formed on the dielectric layer.
Figure 11:
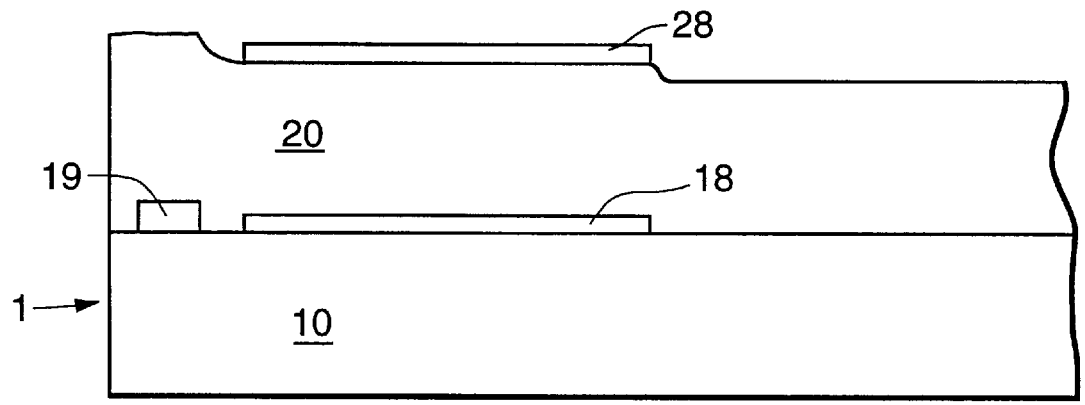
FIG. 11 shows in schematic representation the substrate of FIG. 7 further having a second active region formed on the dielectric layer.

Following formation of mask 30, a second active region 28 can be formed on the active portion 24 of the dielectric layer 20. The resulting structures are illustrated in FIGS. 10 and 11. The structures of FIGS. 10 and 11 correspond to the structures of FIGS. 8 and 9, respectively.

Although illustrated as a two-level semiconductor arrangement, it should be understood by those of skill in the art that the semiconductor arrangement of the present invention can have multiple layers having active regions and dielectric layers dispersed between the active regions, as is conventionally fabricated. In addition, each of the active areas can have associated with it a dummy region as described above.

The following example is included to more clearly demonstrate the overall nature of the invention. This example is exemplary, not restrictive, of the invention.

EXAMPLE

A dummy region and first active region were formed spaced apart from one another on a ceramic substrate by selective deposition of copper metal by evaporation through a molybdenum mask, such that the dummy region was closer to an edge of the ceramic substrate than the first active region. Next, a polyimide layer was spin-applied onto the ceramic substrate. The polyimide layer had a center portion height of 10 microns and an edge portion height of 11.5 microns. A mask was then applied to the polyimide layer. The mask contacted the semiconductor arrangement at end portions of the polyimide layer and did not contact the active portion. Next, a second active region was formed by the sequential deposition of chromium, copper, titanium, and gold through the mask.

Although illustrated and described above with reference to specific embodiments, the present invention is nevertheless not intended to be limited to the details shown. Rather, various modifications may be made in the details within the scope and range of equivalents of the claims and without departing from the spirit of the invention.

What is claimed is:

1. A semiconductor arrangement comprising:
   a substrate having a surface and an edge;
   a first active region disposed on the surface of the substrate;
   a dummy region disposed on the surface of the substrate, spaced from the first active region without any contact, and located closer to the edge of the substrate than is the first active region;
   a dielectric layer disposed on the first active region, the dummy region, and a portion of the surface of the substrate which is not covered by the first active region and the dummy region, the dielectric layer having a surface with an inactive portion and an active portion; and
   mask disposed on the dielectric layer such that the mask contacts the inactive portion and does not contact the active portion.

2. The semiconductor arrangement of claim 1 wherein the substrate is selected from the group consisting of silicon and ceramic.

3. The semiconductor arrangement of claim 1 wherein the first active region is selected from the group consisting of copper, tungsten, aluminum, chromium, and combinations of those metals.

4. The semiconductor arrangement of claim 1 wherein the dummy region is selected from the group consisting of copper, tungsten, aluminum, chromium, and combinations of those metals.

5. The semiconductor arrangement of claim 1 wherein the dummy region is a dielectric material.

6. The semiconductor arrangement of claim 1 wherein the dielectric layer is selected from the group consisting of silicon oxide, silicon nitride, polyimide, and combinations of those materials.

7. The semiconductor arrangement of claim 1 wherein the dielectric layer comprises a center portion and an edge portion, and wherein the edge portion has a greater height than the center portion.

8. The semiconductor arrangement of claim 1 wherein the dummy layer has a height greater than the first active region.

9. A process of producing a semiconductor arrangement, the process comprising the steps of:
   (a) forming a first active region and a dummy region on a surface of a substrate, such that:
      (i) the first active region and the dummy region are spaced from one another without any contact, and
      (ii) the dummy region is closer to an edge of the surface of the substrate in comparison to the first active region;
   (b) forming a dielectric layer on the first active region, the dummy region, and a portion of the surface of the substrate which is not covered by the first active region and the dummy region, the dielectric layer having a surface with an inactive portion and an active portion; and
   (c) applying a mask on the dielectric layer such that the mask contacts the inactive portion and does not contact the active portion.

10. The process of claim 9 wherein the dummy region is formed by selective evaporation of a material through a mask.

11. The process of claim 9 wherein the dielectric layer is formed by spin-on applying a dielectric material.

12. The process of claim 9 wherein the dielectric layer is formed by an extrusion process.

13. The process of claim 9 wherein the dielectric layer is formed by a meniscus coating process.

14. The process of claim 9 wherein the dielectric layer is formed by chemical vapor deposition.

15. A semiconductor arrangement produced by the steps of:
   (a) forming a first active region and a dummy region on a surface of a substrate, such that:
      (i) the first active region and the dummy region are spaced from one another without any contact, and
      (ii) the dummy region is closer to an edge of the surface of the substrate in comparison to the first active region;
   (b) forming a dielectric layer on a portion of the surface of the substrate which is not covered by the first active region and the dummy region, the dielectric layer covering the first active region and the dummy region and having a surface with an inactive portion and an active portion; and
   (c) applying a mask on the dielectric layer such that the mask contacts the inactive portion and does not contact the active portion.

16. The semiconductor arrangement of claim 15 wherein the dummy region is selected from the group consisting of copper, tungsten, aluminum, chromium, and combinations of those metals.

17. The semiconductor arrangement of claim 15 wherein the dummy region is a dielectric material.

18. The semiconductor arrangement of claim 15 wherein the dielectric layer comprises a center portion and an edge portion, and wherein the edge portion has a greater height than the center portion.

19. The semiconductor arrangement of claim 15 wherein the dummy layer has a height greater than the first active region.

20. The semiconductor arrangement of claim 15 wherein the dielectric layer is formed by spin-on applying a dielectric material.

* * * * *